(12) United States Patent  
Schroeder

(10) Patent No.: US 7,006,196 B2
(45) Date of Patent: Feb. 28, 2006

(54) REAL TIME IMAGE RESIZING FOR DYNAMIC DIGITAL PHOTOLITHOGRAPHY

(75) Inventor: Dale W. Schroeder, Scotts Valley, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 110 days.

(21) Appl. No.: 10/736,730

(22) Filed: Dec. 15, 2003

(65) Prior Publication Data
US 2005/0128450 A1 Jun. 16, 2005

(51) Int. Cl.
*G03B 27/42* (2006.01)
*G09G 5/00* (2006.01)
*G02F 26/00* (2006.01)

(52) U.S. Cl. .................. 355/53; 345/660; 359/292
(58) Field of Classification Search .................. 355/53, 355/67, 75, 77; 348/428.1; 345/660; 359/292
See application file for complete search history.

(56) References Cited

U.S. PATENT DOCUMENTS

| 6,005,988 A | 12/1999 | Schroeder |
| 2003/0099026 A1 * | 5/2003 | Sandstrom .................. 359/292 |
| 2004/0032419 A1 * | 2/2004 | Zhou et al. .................. 345/660 |

* cited by examiner

*Primary Examiner*—Peter B. Kim

(57) ABSTRACT

A dynamic photolithography system resizes a pattern in real time and photolithographically transfers an image of the resized pattern onto a surface to compensate for distortions in the surface and/or optics. The system uses two or more pre-stored spatially offset renderings of the pattern. Each spatially offset rendering includes pixel data identifying light modulation elements within a spatial light modulator representing the pattern. The pattern is spatially offset between the renderings. Portions of the two or more spatially offset renderings are selected as a function of the distortion to resize the pattern and photolithographically transfer the image of the resized pattern onto the surface.

33 Claims, 12 Drawing Sheets

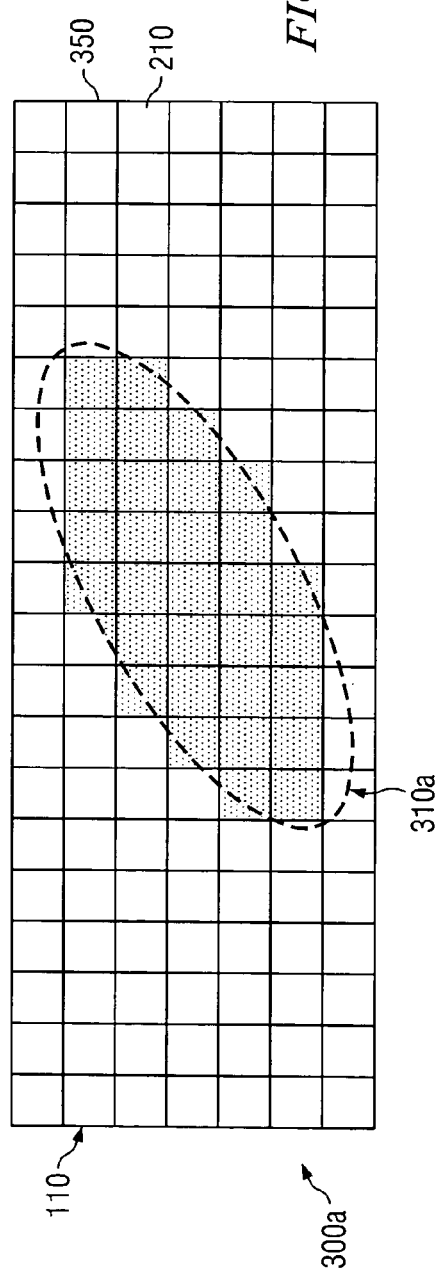
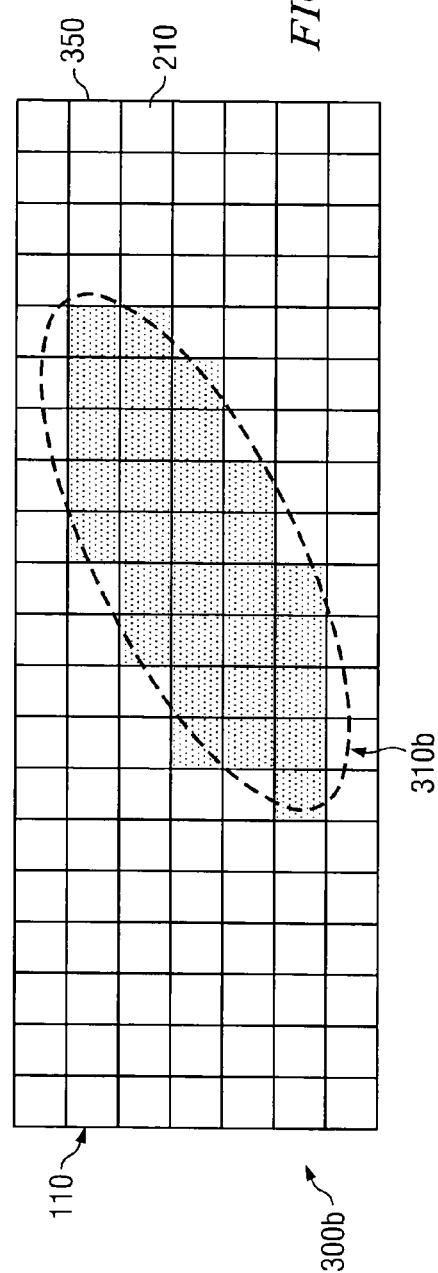
FIG. 3A
FIG. 3B

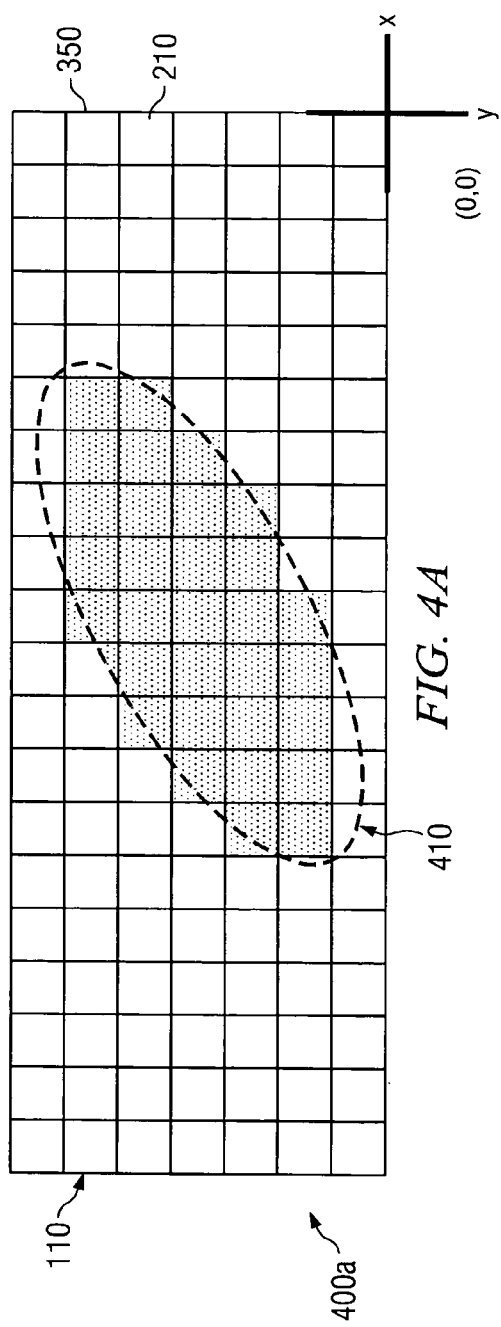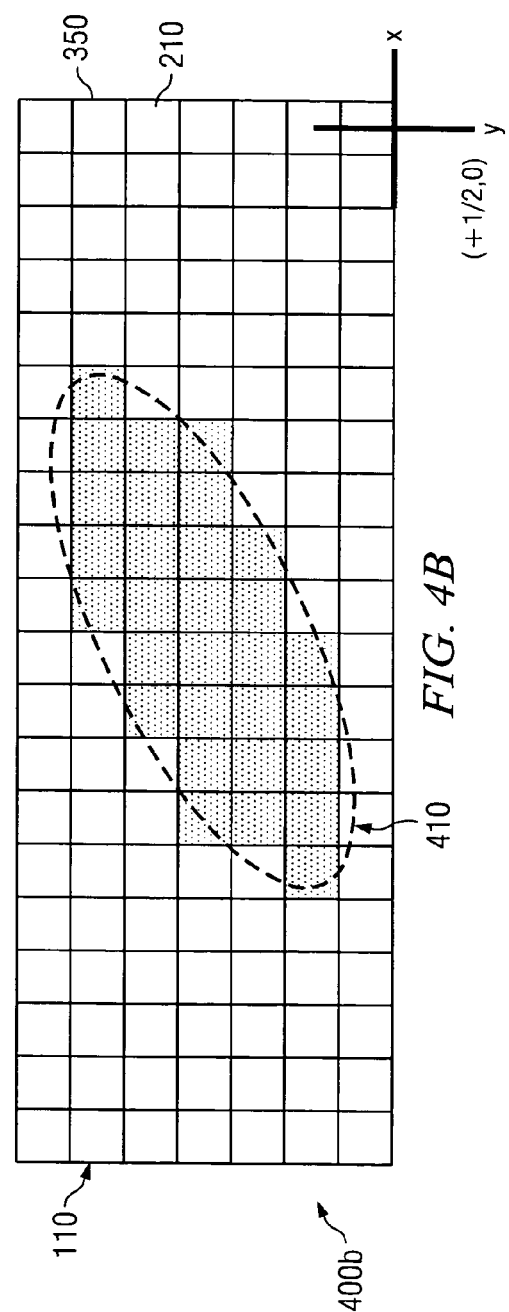
FIG. 4A
FIG. 4B

REAL TIME IMAGE RESIZING FOR DYNAMIC DIGITAL PHOTOLITHOGRAPHY

CROSS-REFERENCE TO RELATED APPLICATIONS

This application is related by subject matter to U.S. application Ser. No. 10/737,126 entitled SPATIAL LIGHT MODULATOR AND METHOD FOR PERFORMING PHOTOLITHOGRAPHY; Ser. No. 10/736,724, entitled DEFECT MITIGATION IN SPATIAL LIGHT MODULATOR USED FOR DYNAMIC PHOTOLITHOGRAPHY; and Ser. No. 10/736,090, entitled LIQUID CRYSTAL CELL THAT RESISTS DEGRADATION FROM EXPOSURE TO RADIATION, each filed on an even date herewith.

BACKGROUND OF THE INVENTION

1. Technical Field of the Invention

The present invention relates generally to photolithography, and more particularly, to dynamic photolithography systems.

2. Description of Related Art

Photolithography is a method of transferring a pattern or image onto a substrate. Some industrial uses of photolithography include the manufacture of products, such as flat panel displays, integrated circuits (ICs), IC packaging, planar lightwave circuits (photonics), printed circuit boards, flexible circuits/displays and wafer bumping. In its simplest form, a photolithography system operates by passing light through a mask or tool placed over a substrate having a photosensitive surface, such as a layer of photoresist. Typically, the mask is formed of a transparent material with a fixed opaque pattern inscribed on the surface. Due to the photosensitivity of the substrate surface, when placed in contact with the mask and exposed to light, the pattern inscribed on the mask is transferred onto the substrate surface.

Most photolithography systems attempt to tightly control the processing conditions because variations in temperature and humidity can alter the shape or size of various surfaces. When the size of features to be photolithographically transferred onto the substrate surface is large, minor distortions in the substrate surface or mask can be accommodated using various alignment techniques. However, as technology has progressed and the feature size has decreased to 0.5 $\mu$m and smaller, conventional alignment techniques have been unable to adequately compensate for dimensional changes in either the substrate or the mask itself. In addition, traditional direct contact photolithography systems do not allow for corrections in the image size without requiring a new mask to be created, which is a costly and time-consuming process. Furthermore, even more advanced non-contact photolithography systems that use projection optics to separate the mask from the substrate are not able to correct for all types of distortions. For example, although simple global adjustments can be made optically using extra lenses, traditional non-contact photolithography systems cannot compensate for local distortions in the surface or distortions in the optical system itself.

Recently, dynamic photolithography systems have been developed that enable a pattern to be transferred onto a substrate surface without the use of a physical mask. Dynamic photolithography systems commonly employ a spatial light modulator (SLM) to define a pattern that is imaged onto the substrate surface. SLMs are electrically controlled devices that include individually controllable light modulation elements that define pixels of an image in response to electrical signals. Typically, at feature sizes of 0.5 $\mu$m or smaller, there are tens of millions of light modulation elements within an SLM, with each light modulation element being under 4 $\mu$m square.

However, each light modulation element is at a fixed location on the SLM, and each light modulation element can only be in one of two pixel states: full on or full off. As such, to resize the image transferred onto the surface to compensate for optical and surface distortions, the pixel data loaded into the SLM must be modified. For example, to stretch or shrink an image, an entire row or column of pixels in the image can be duplicated or deleted and rendered onto the array of light modulation elements. Unfortunately, the average error produced by duplicating or deleting pixels is ¼ pixel, and the peak error is ½ pixel. In addition, line widths can change up to ±50%, and diagonal lines can suffer from "jaggies" at each duplicate/delete point. An alternative to duplicating/deleting is to recompute the pattern and render the recomputed pattern onto the light modulation element array in real time to form a resized image. However, the many factors involved in computing the image, including optical system bandwidth, photoresist nonlinearities and adjacent features, make real time calculation difficult and expensive. In addition, recomputing the pattern/image for each image transfer is impracticable due to the high data rates (equivalent to 2,000 lap top screens of data/second) required in dynamic photolithography systems. Therefore, what is needed is a dynamic photolithography system capable of resizing an image in real time.

SUMMARY OF THE INVENTION

Embodiments of the present invention provide a dynamic photolithography system and method for resizing a pattern in real time to dynamically photolithographically transfer an image of the resized pattern onto a surface. Two or more spatially offset renderings of the pattern are generated, with each rendering including pixel data representing the pattern. The pattern is spatially offset between the renderings. Portions of the two or more spatially offset renderings are selected to resize the pattern and photolithographically transfer the image of the resized pattern onto the surface.

The dynamic photolithography system includes a spatial light modulator having light modulation elements for photolithographically transferring the image onto the surface and an image processing system operable to generate and store the two or more spatially offset renderings of the pattern. The image processing system is further operable to load the pixel data corresponding to the selected portions of the two or more spatially offset renderings of the pattern into the spatial light modulator. In one embodiment, the portions of the two or more spatially offset renderings are selected as a function of distortion in the surface. In another embodiment, the portions of the two or more spatially offset renderings are selected as a function of distortion in the optics of the dynamic photolithography system.

By generating and storing spatially offset renderings of the pattern, image resizing can be performed in real time by simply selecting and loading the portions of the spatially offset renderings to compensate for surface and/or optics distortions. No real time image computations are needed, thereby decreasing costs and increasing the throughput speed. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show sample embodiments of the invention and which are incorporated in the specification hereof by reference, wherein:

FIGS. 3A and 3B illustrate two renderings of patterns having varying sizes onto an array of light modulation elements;

FIGS. 4A–4D illustrate spatially offset renderings of a pattern onto an array of light modulation elements, in accordance with embodiments of the present invention;

DETAILED DESCRIPTION OF THE EXEMPLARY EMBODIMENTS

Figure 1:
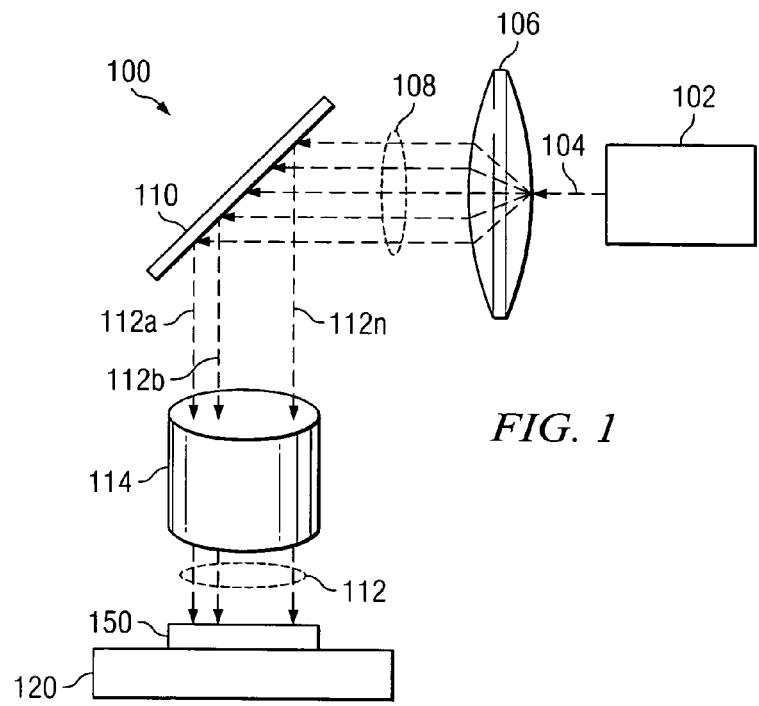
FIG. 1 illustrates a dynamic photolithography system utilizing a spatial light modulator to photolithographically transfer an image onto a substrate, in accordance with embodiments of the present invention.

FIG. 1 illustrates a dynamic photolithography system 100 for photolithographically transferring an image to a substrate 150 in accordance with embodiments of the present invention. The photolithography system 100 includes a light source 102 operable to output light 104. The light source 102 can be a laser, such as an excimer laser, or other non-laser source, as understood in the art. The light source 102 is optically coupled to beam shaping optics 106. The output of the beam shaping optics 106 is light 108 that is directed toward a spatial light modulator 110. The spatial light modulator 110 includes light modulation elements (not shown) operable to selectively transfer the light 108. The light modulation elements are described in more detail below in connection with FIGS. 2A and 2B. In one embodiment, the light modulation elements are liquid crystal elements. However, it should be understood that in other embodiments, the light modulation elements are micromirrors or another type of optical device that can selectively transfer light by reflection, transmission or otherwise.

The output of the spatial light modulator 110 includes dark areas with no light and light areas made up of multiple light beams 112a–112n (collectively 112) that are transferred by selected light modulation elements to form at least a portion of an image containing a pattern. The light beams 112 are directed to projection optics 114, which is optically aligned to direct the light beams 112 onto the substrate 150. A photosensitive layer (not shown), such as a layer of photoresist, is on the surface of the substrate 150. The photosensitive layer reacts in response to the light beams 112 to produce the pattern on the surface of the substrate 150. In effect, the spatial light modulator 110 operates as a dynamic mask that forms a pattern that is imaged onto the photosensitive layer of the substrate.

In one embodiment, the substrate 150 is mounted on a scanning stage 120 to move the substrate 150 in any direction relative to the spatial light modulator 110. The scanning stage 120 can be, for example, a high precision scanning stage. In another embodiment, the substrate 150 remains stationary and the optics and/or light beams 112 move relative to the substrate 150. In either configuration, one of the substrate 150 and the spatial light modulator 110 is moved relative to the other to transfer the image onto the substrate 150.

Figure 2A:
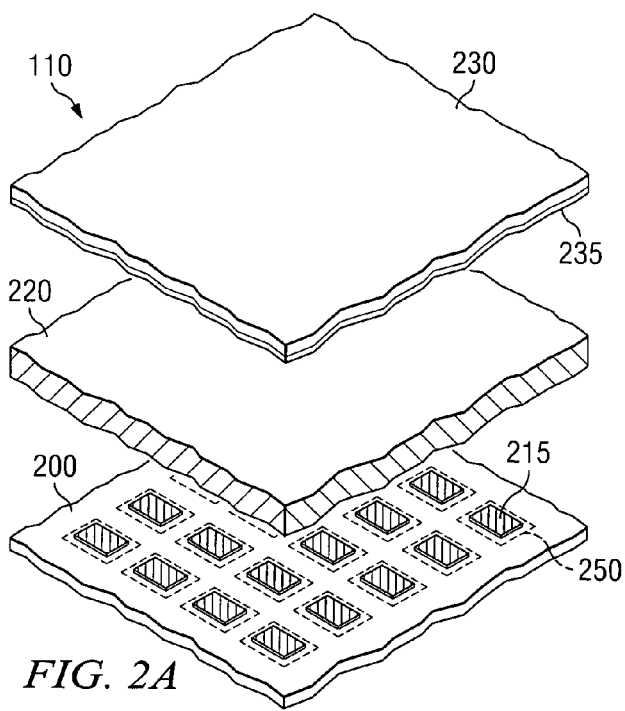
FIG. 2A is an exploded view of a spatial light modulator utilizing liquid crystal light modulation elements.
Figure 2B:
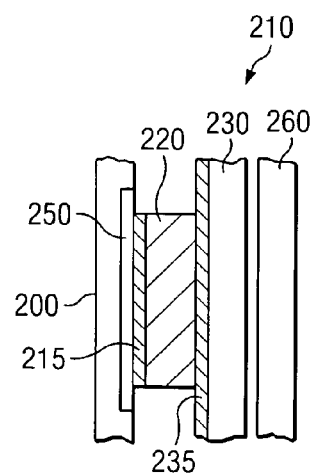
FIG. 2B is a cross-sectional view of a liquid crystal light modulation element of FIG. 2A.
Figure 4C:
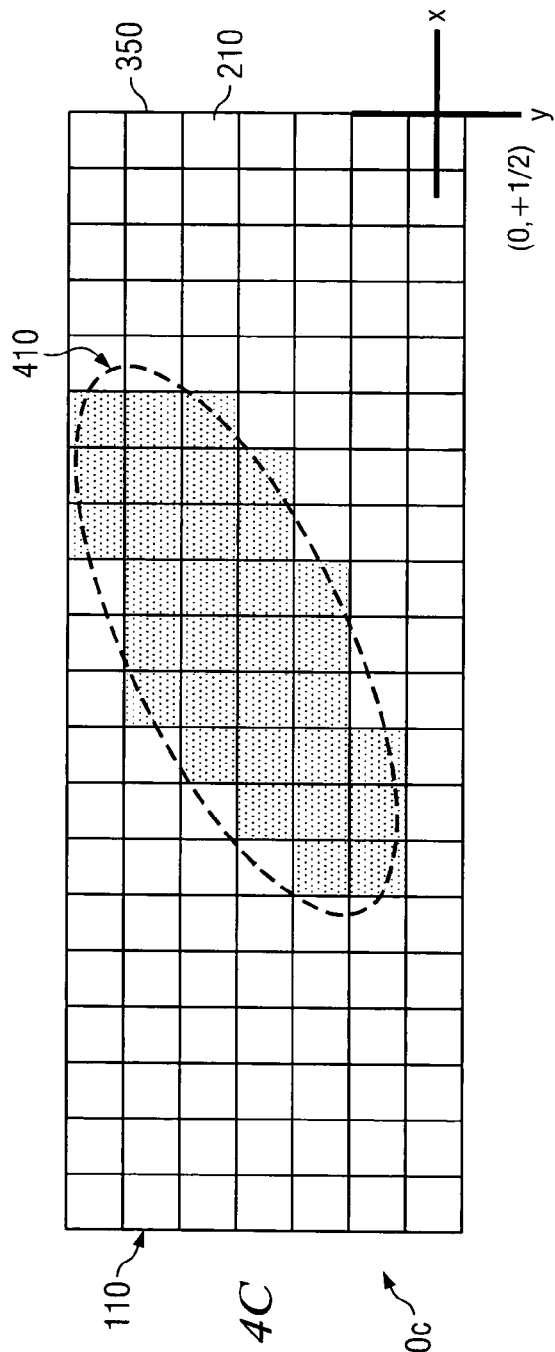
Figure 4D:
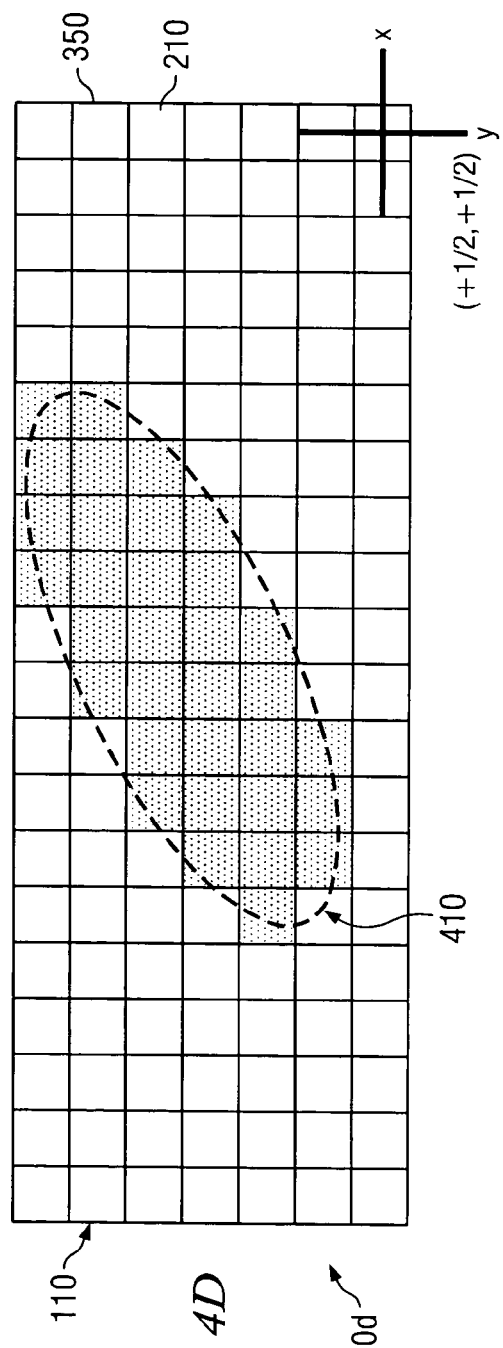

FIGS. 2A and 2B illustrate an example of an SLM 110 with liquid crystal (LC) light modulation elements 210 that define pixels of an image. The SLM 110 in FIGS. 2A and 2B is a liquid crystal on silicon (LCOS) SLM including individual LC light modulation elements 210 that selectively reflect light of a particular polarization to transfer an image of a pattern onto a substrate. FIG. 2A is an exploded view of a portion of the LCOS SLM, and FIG. 2B is a cross-sectional view of an LC light modulation element 210 of the LCOS SLM 110. As can be seen in FIG. 2A, the LCOS SLM 110 includes a substrate 200 on which pixel electrodes 215 are located. The pixel electrodes 215 can be arranged in an array of rows and columns or in a nonorthogonal pattern. Within the substrate 200 below each pixel electrode 215 is located a pixel drive circuit 250 connected to drive the overlying pixel electrode 215. Disposed above the substrate 200 is a transparent glass 230 coated with a layer 235 of transparent electrically conductive material, such as indium tin oxide (ITO). The ITO layer 235 is the common electrode of the LCOS SLM 110. Encapsulated between the substrate 200 and the glass 230 is a layer 220 of liquid crystal material that reacts in response to electric fields established between the common electrode 235 and pixel electrodes 215.

Thus, as shown in FIG. 2B, the pixel electrodes 215 in combination with the liquid crystal material 220, common electrode 235, pixel drive circuits 250 and polarizer 260 form respective individual light modulation elements 210 that define pixels of an image. Depending on the voltages applied between the pixel electrodes 215 and common electrode 235, the liquid crystal material 220 reacts at each light modulation element 210 to either change or not change the polarization state of incoming light. The light modulation elements 210 in combination with polarizer 260 of the SLM 110 allow light of a particular polarization to be reflected or not reflected onto the substrate 150 of FIG. 1. It should be understood that polarizer 260 includes one or more polarizers, as known in the art.

Although only a few light modulation elements 210 are illustrated in FIGS. 2A and 2B, each LCOS SLM 110 typically includes tens of millions of light modulation elements 210 over an SLM 110 area that is not more than a few square centimeters. For example, in one embodiment, the LCOS SLM 110 includes a matrix of 16,384 columns by 606 rows of light modulation elements 210, with each light modulation element 210 being under 4 μm square. However, each light modulation element 210 is at a fixed location on the SLM 110, and each light modulation element 210 can only be in one of two pixel states: full on or full off. Therefore, when resizing an image, the pixellated structure of the SLM 110 must be considered.

For example, referring to FIGS. 3A and 3B, two different sized patterns 310a and 310b are shown mapped onto an array 350 of light modulation elements 210 within the SLM 110 to form renderings 300a and 300b. Pattern 310b is shown to be approximately 5% wider than pattern 310a. In order to achieve a 5% stretch between renderings 300a and 300b, pattern 310a itself is stretched 5% to form pattern 310b and pattern 310b is spatially mapped onto the array 350. To map pattern 310b onto the array 350, the pixel state (on or off) of each individual light modulation element 210 within the array 350 is selected depending on the mapping. For example, in FIG. 3B, an on pixel state is selected for a light modulation element 210 that has more than ½ of the light modulation element area covered by the pattern 310b. Otherwise, an off pixel state is selected for the light modulation element 210. Pixel data representing the selected pixel states for each light modulation element 210 is stored and loaded into the spatial light modulator to transfer an image of the pattern 310b. Since the light modulation element 210 sizes are fixed within SLMs, each rendering 300a and 300b would need to be separately computed by resizing the pattern and mapping the resized pattern onto the array prior to each image transfer.

To overcome the limitations in resizing patterns due to the fixed light modulation element size in SLMs, in accordance with embodiments of the invention, two or more spatially offset renderings of the pattern are generated and stored. Spatially offset renderings are renderings of the pattern mapped onto the array of the spatial light modulator with the pattern in positions relative to the array that are spatially offset from one another. From the spatially offset renderings, a pattern can be resized by selecting portions of the spatially offset renderings that provide the best alignment for the resized pattern. For example, in FIGS. 4A–4D, four exemplary spatially offset renderings 400a–400d of a pattern 410 are shown mapped onto the array 350 within the spatial light modulator 110, in accordance with embodiments of the present invention. The pattern 410 is offset within each of the spatially offset renderings 400a–400d by ½ of one dimension of a light modulation element in (X,Y), (X+½, Y), (X,Y+½), (X+½,Y+½) positional alignments. In FIGS. 4A–4D, the positional alignments are (0,0), (+½,0), (0,+½) and (+½,+½). Each spatially offset rendering 400a–400d is generated by mapping the pattern 410 onto the array 350 in a respective positional alignment and identifying the light modulation elements 210 that best represent the pattern 410. Pixel data corresponding to the spatially offset renderings 400a–400d is stored and used to resize the pattern to be imaged onto a substrate. It should be understood that the number of spatially offset renderings 400a–d and the pattern offset between renderings 400a–d varies, depending on the application.

Figure 5:
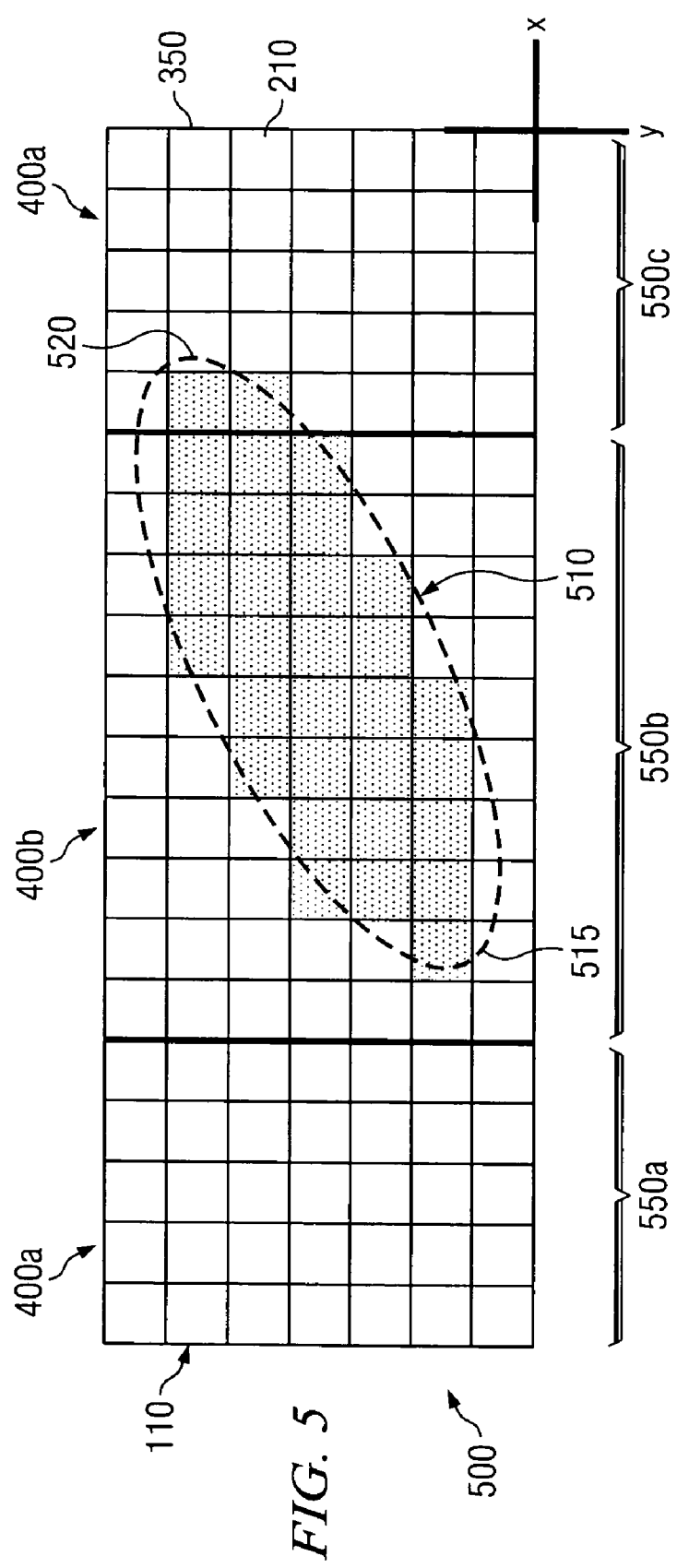
FIG. 5 is an illustration of a rendering of a resized pattern using portions of two of the spatially offset renderings in FIGS. 4A–4D, in accordance with embodiments of the present invention.

FIG. 5 illustrates an example of a rendering 500 of a resized pattern 510 mapped onto the array 350 of the SLM, in accordance with embodiments of the invention. The resized pattern 510 is formed using portions of two of the spatially offset renderings 400a and 400b in FIGS. 4A–4D. The rendering 500 is shown separated into three sections 550a–c, each corresponding to a different portion of one of the spatially offset renderings 400a or 400b. Section 550a includes a portion of rendering 400a from a corresponding section in FIG. 4A, section 550b includes a portion of rendering 400b from a corresponding section in FIG. 4B and section 550c includes a portion of rendering 400a from a corresponding section in FIG. 4A. Sections 550a–c are mapped onto the array 350, such that each section 550a–c includes pixel data loaded into light modulation elements 210 of the array 350 that correspond to light modulation elements 210 of renderings 400a and 400b.

As shown in FIGS. 4A and 4B, the pattern 410 in rendering 400b is offset from the pattern 410 in rendering 400a by ½ of a light modulation element in the x-direction. Therefore, by using a combination of renderings 400a and 400b, the pattern 410 can be stretched or shrunk in the x-direction. For example, the pattern 410 in rendering 400b is shown shifted to the left in the x-direction. Thus, when a portion of rendering 400a is spatially selected before a portion of rendering 400b along the x-axis, the resized pattern 510 with respect to those selected portions is shrunk in the x-direction. Likewise, when a portion of rendering 400a is spatially selected after a portion of rendering 400b, the resized pattern 510 with respect to those selected portions is stretched in the x-direction.

In FIG. 5, a portion of rendering 400b is shown spatially selected after a portion of rendering 400a along the x-axis to shift a starting point 415 of resized pattern 510 to the right ½ of a pixel from the start of pattern 410 in rendering 400a. In addition, a portion of rendering 400a is shown spatially selected after rendering 400b along the x-axis to shift an ending point 420 of resized pattern 510 to the right ½ of a pixel from the end of pattern 410 in rendering 400b. The result of the combination of renderings 400a and 400b in FIG. 5 is a rendering 500 of a resized pattern 510 that has been stretched approximately 5% in the x-direction. It should be understood that the number and size of selected portions of each available rendering varies along both the x-axis and the y-axis to accommodate any alignment, size or other type of distortion. By selecting portions of spatially offset renderings to resize a pattern, the average error for an offset of ½ of a light modulation element is only ⅛ light modulation element, and the peak error is only ¼ light modulation element. In addition, pattern and image resizing can be performed in real time to compensate for distortions in the substrate surface or optics, while maintaining high throughput rates.

Figure 6:
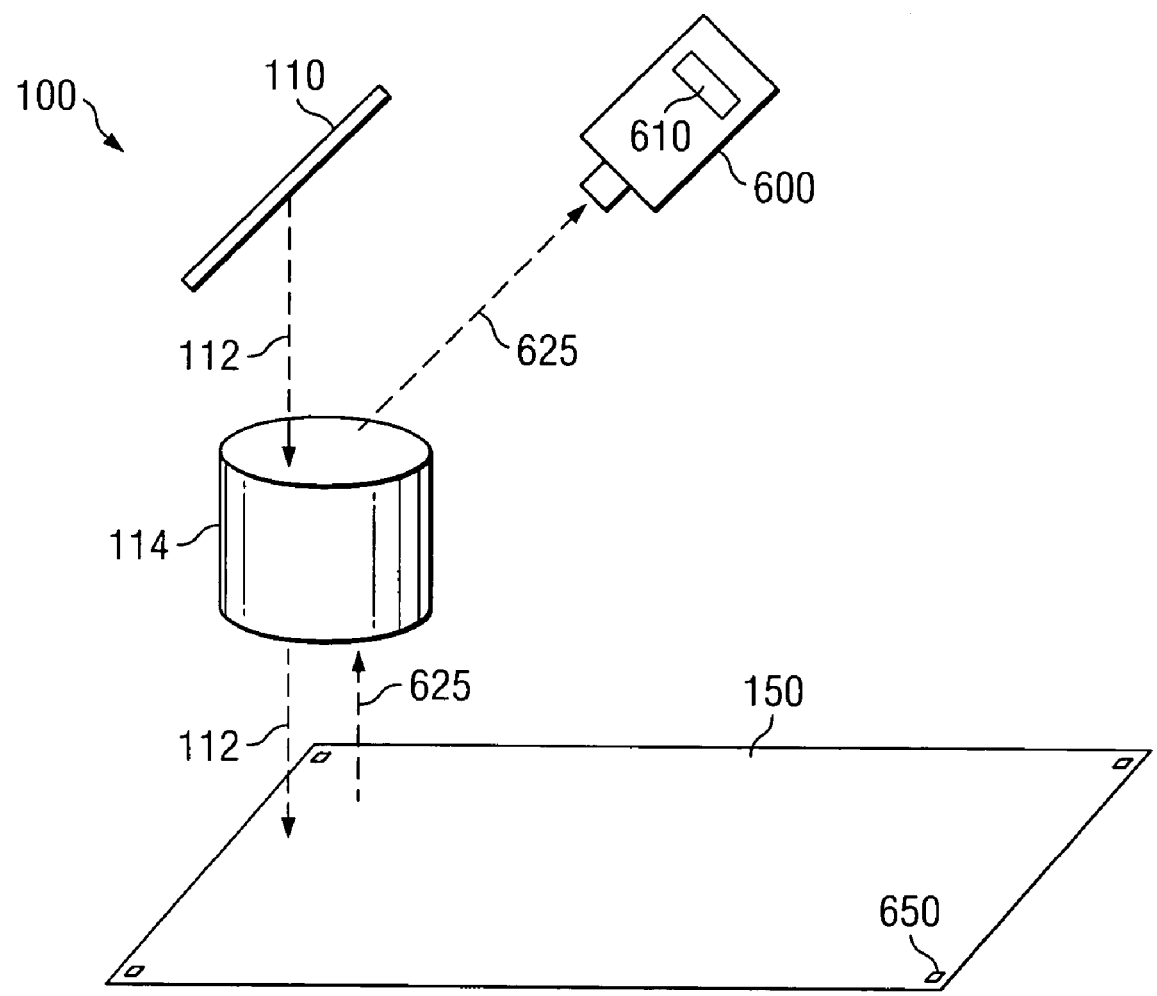
FIG. 6 is an illustration of a portion of the dynamic photolithography system of FIG. 1 including a camera for measuring distortion in the substrate surface, in accordance with embodiments of the present invention.

FIG. 6 is an illustration of a portion of a dynamic photolithography system 100 including a camera 600 for measuring distortion in the substrate surface, in accordance with embodiments of the present invention. The distortion can include, for example, stretching, shrinking, tilting or bowing in the substrate 150. The spatial light modulator 110 is shown optically coupled to projection optics 114 to direct light beams 112 reflected by selected light modulation elements to form at least a portion of an image of a pattern onto the substrate 150. The projection optics 114 is further configured to direct light 625 reflected from the substrate 150 towards the camera 600 to measure distortion in the substrate surface. In one embodiment, the projection optics 114 includes a beam splitter (not shown) optically aligned with the camera 600 to direct the light 625 reflected from the substrate 150 toward the camera 600. In another embodiment, the projection optics 114 includes two positionally distant optical elements, one of the optical elements being configured to direct the light beams 112 onto the substrate 150 and the other optical element being configured to direct light 625 reflected from the substrate 150 toward the camera 600.

The substrate 150 is marked with one or more alignment features 650, such as fiducials, that are used to determine the distortion in the surface of the substrate 150. Light 625 reflected from the substrate 150 is received at image sensor 610 within the camera 600 to capture images of the alignment features 650 on the substrate 150. In one embodiment, the relative position of the substrate 150 with respect to the projection optics 114 is altered to optically align the projection optics 114 with each of the alignment features 650 on the substrate 150 to enable the image sensor 610 to capture a sequence of images of the alignment features 650. In another embodiment, the camera 600 includes multiple cameras positioned at one or more locations with respect to the substrate 150 to simultaneously capture respective images of different alignment features 650 on the substrate 150.

Figure 7A:
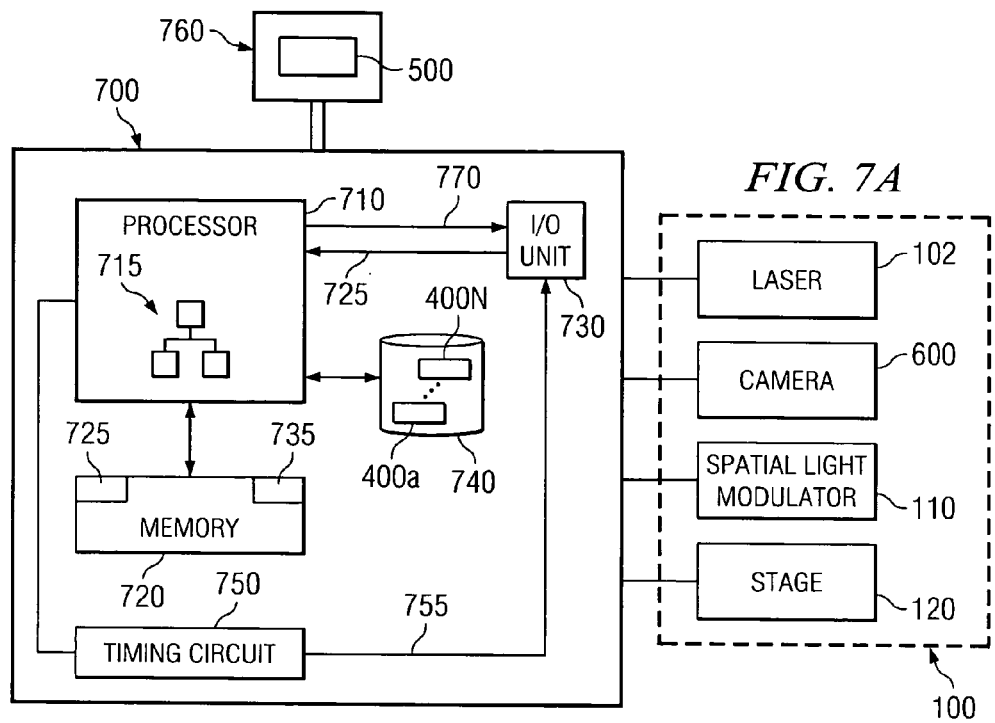
FIG. 7A is a block diagram of an exemplary image processing system for generating and storing the spatially offset renderings and controlling the dynamic photolithography system of FIG. 1.

FIG. 7A is a block diagram of an image processing system 700 for generating and storing the spatially offset renderings and controlling the dynamic photolithography system 100. The image processing system 700 includes a processing unit 710 operable to execute software 715 to generate two or more spatially offset renderings 400a . . . 400N of a pattern to be photolithographically transferred onto the substrate 150 of FIG. 1. The processing unit 710 can be any type of microprocessor, microcontroller, programmable logic device, digital signal processor or other processing device. The processing unit 710 is coupled to a storage unit 740 to store the spatially offset renderings 400a . . . 400N and a timing circuit 750 that generates timing signals 755 to control the operation of the stage 120, spatial light modulator 110, laser 102 and camera 600 of the dynamic photolithography system 100.

The processing unit 710 is further coupled to a memory unit 720 and input/output (I/O) unit 730, which can be wired or wireless. The I/O unit 730 is connected to receive alignment data 725 representing one or more images of alignment features on the substrate surface from the camera 600, and provide the alignment data 725 to the processing unit 710 for storage in the memory unit 720. The processing unit 710 is configured to execute software 715 for calculating distortion in the substrate as a function of the alignment data 725 or distortion in the optics of the system and to store distortion data 735 corresponding to the calculated distortion in the memory unit 720. The processing unit is further configured to execute software 715 for selecting portions of the stored renderings 400a . . . 400N to generate a rendering 500 of a resized pattern as a function of the distortion data 735, and communicate pixel data 770 representing the resized rendering 500 to the spatial light modulator 110 via the I/O unit 730. A display 760 is optionally coupled to the image processing system 700 and operable to display the resized rendering 500 that is to be communicated to the spatial light modulator 110 for transferring onto the surface of the substrate.

Figure 7B:
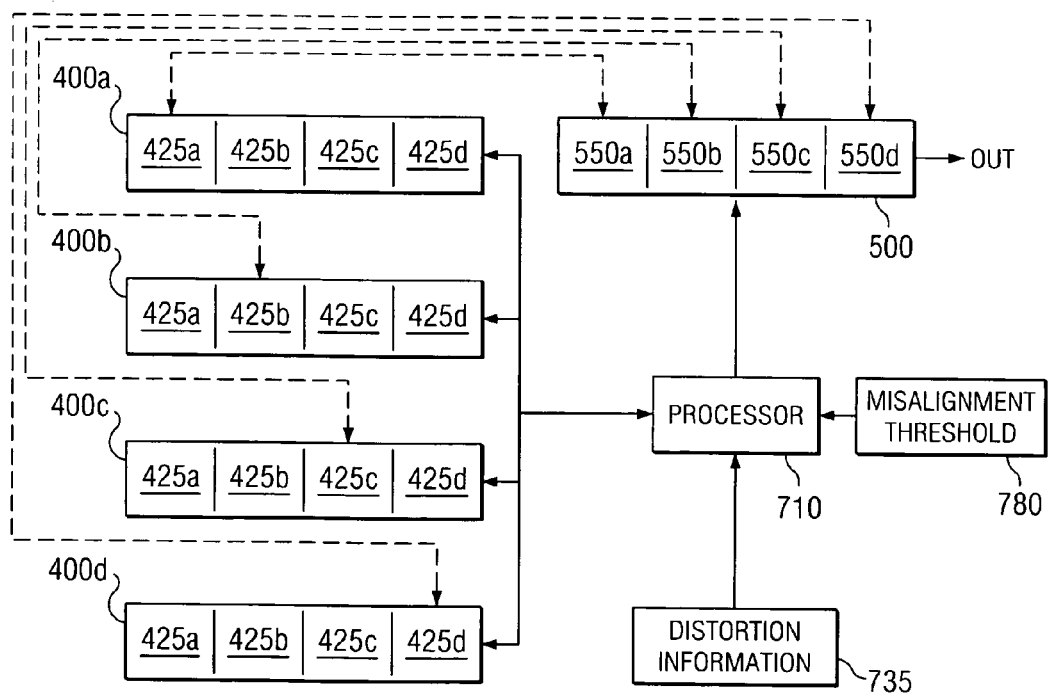
FIG. 7B is an illustration of an exemplary processing unit for selecting portions of spatially offset renderings of the image to generate a rendering of a resized pattern.

An example of a configuration of a processing unit 710 for selecting portions of the stored spatially offset renderings 400a–d to generate the resized rendering 500 is shown in FIG. 7B. Each spatially offset rendering 400a–d is shown separated into corresponding sections 425a–d. In one embodiment, the sections 425a–d each include pixel data indicative of one or more rows and/or one or more columns of light modulation elements. In other embodiments, the sections 425a–d each include pixel data indicative of one or more light modulation elements in any adjacent configuration, such as a block of light modulation elements. The processing unit 710 accesses the spatially offset renderings 400a–d to select sections 425a–d from one or more of the spatially offset renderings 400a–d and inputs the pixel data from the selected sections 425a–d into corresponding sections 550a–d of the resized rendering 500. The sections 425a–d are selected by the processing unit 710 as a function of the distortion information 735 calculated by the processing unit 710. The distortion information 735 identifies the distortion in the substrate surface and/or the distortion in the optics of the dynamic photolithography system.

In one embodiment, the processing unit 710 further uses a misalignment threshold 780 to select the sections 550a–d of the resized rendering 500. The misalignment threshold 780 is a threshold against which the alignment of the various sections 425a–d of the spatially offset renderings 400a–d relative to the substrate surface as a function of the distortion information 735 is measured. If a particular section 425a–d of a spatially offset rendering 400a–d produces a misalignment relative to the substrate surface greater than the misalignment threshold when considering the distortion information, that particular section 425a–d is not selected for inclusion in the resized rendering 500. For example, as shown in FIGS. 4A–4D, feature 410 is offset within each rendering 400a–d by ½ of a light modulation element in either or both of the x-direction and the y-direction. To generate the resized rendering 500 of FIG. 5, the sections 550a–c can be selected using a misalignment threshold 780 of ¼ pixel. Thus, the portion of rendering 400a in FIG. 4A selected for inclusion in section 550a of FIG. 5 produces a misalignment relative to the surface as a function of the distortion less than the misalignment threshold, and likewise for sections 550b and 550c.

The misalignment threshold 780 can be implemented using any type of algorithm or mechanism. In one embodiment, the misalignment threshold 780 is implemented with an address adder that contains fractional and integer sections. As an example, the misalignment threshold 780 can correspond to an addend of two. If the addend is exactly two, there is no need to switch to a different rendering. If the addend is greater than two, a rendering that shrinks the pattern is selected, and if the addend is less than two, a rendering that stretches the pattern is selected. One example of an address adder used for enlarging or shrinking stored digital images is described in U.S. Pat. No. 6,005,988, which is hereby incorporated by reference. However, it should be understood that other methods can be used to select portions of renderings to resize a pattern and corresponding image of the pattern on a surface.

Figure 8:
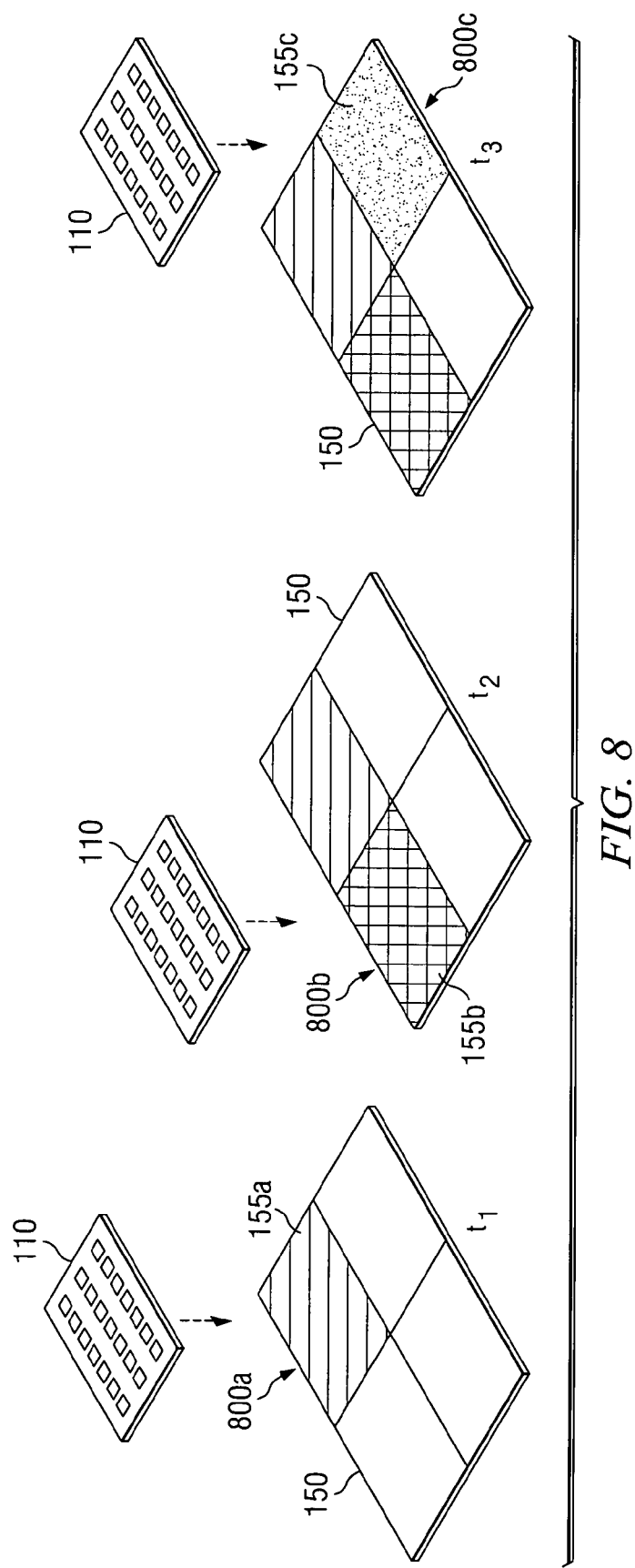
FIG. 8 illustrates a timing sequence for transferring sub-images of the image onto the substrate surface.

FIG. 8 illustrates a timing sequence for transferring an image onto the surface of the substrate 150. With an SLM 110 that is not more than a few square centimeters in area, multiple exposures are generally required to image the entire area of the substrate 150. Each exposure transfers a different subimage 800a–c of the image (collectively 800) onto a corresponding area 155a–c of the substrate 150. For large substrates 150, multiple passes over the substrate 150 may be required to image the entire area (collectively 155) of the substrate 150. With a precision stage, the alignment of each exposure can be carefully controlled to seamlessly stitch the subimages 800a–c together. For example, as shown in FIG. 8, at time $t_1$, subimage 800a is transferred onto area 155a of the substrate 150. At time $t_2$, subimage 800b is transferred onto area 155b of the substrate 150, and at time $t_3$, subimage 800c is transferred onto area 155c of the substrate 150.

Figure 9A:
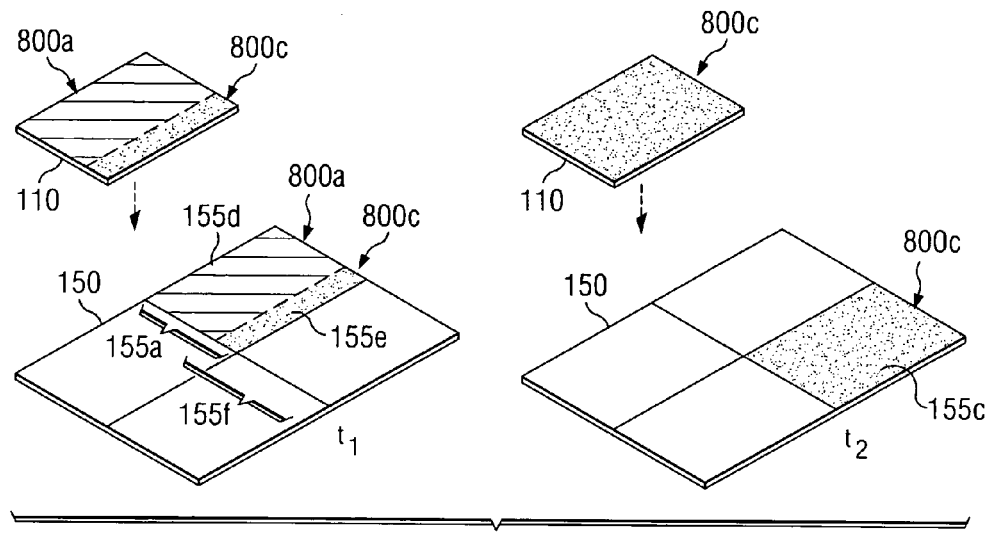
FIGS. 9A and 9B illustrate one example of an image resizing technique, in accordance with embodiments of the present invention.
Figure 9B:
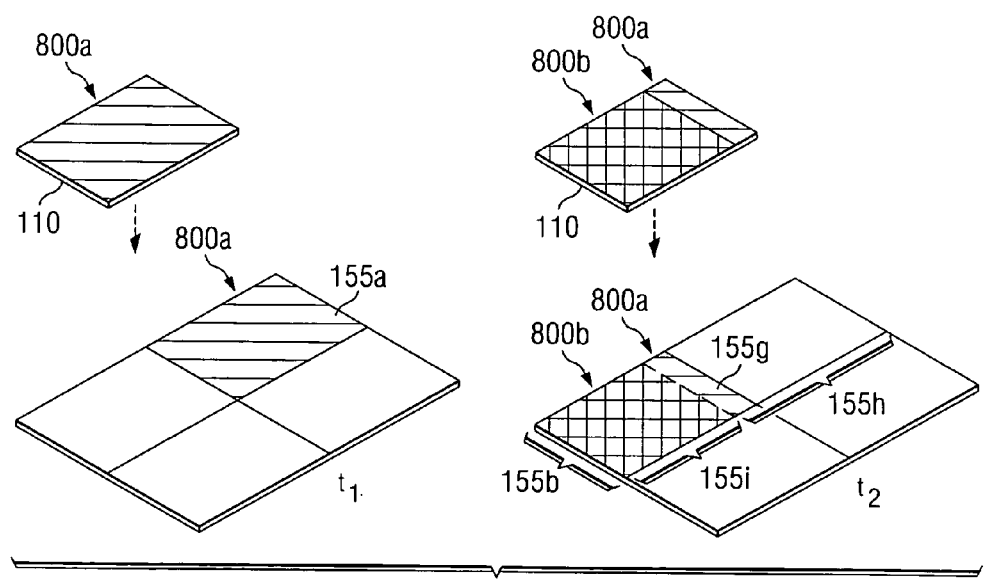

When distortions in the substrate surface and/or optics require resizing of the pattern to be imaged onto the substrate, either the amount of the pattern in one or more of the subimages 800a–c of the image is altered or the size of one or more subimages 800a–c is altered to reflect the resized pattern. In either case, the pixel data loaded into the SLM 110 is representative of the resized pattern. There are various techniques to transfer resized features within subimages 800a–c onto the substrate surface. FIGS. 9A and 9B illustrate one example of an image resizing technique, in accordance with embodiments of the present invention. In FIG. 9A, the pattern in subimage 800a is resized to cover a smaller area 155d on the surface of the substrate 150 and the pattern in subimage 800c is resized to cover a larger area 155f on the surface of the substrate 150 to accommodate for distortion in the substrate 150 and/or optics. During the exposure at time $t_1$, the SLM 110 is loaded with pixel data representing resized subimage 800a and a portion of resized subimage 800c, and transfers resized subimage 800a and the portion of resized subimage 800c onto area 155a during a single exposure. The resized subimage 800a is transferred onto area 155d of the substrate 150 and the portion of resized subimage 800c is transferred onto area 155e of the substrate 150. Areas 155d and 155e combined are equivalent to area 155a in FIG. 8. During the exposure at time $t_2$, the SLM 110 is loaded with pixel data representing the remainder of resized subimage 800c, and transfers the remainder of resized subimage 800c onto area 155c of the substrate 150.

FIG. 9B illustrates another example, in which the pattern in subimage 800a is resized to cover a larger area 155h on the surface of the substrate 150 and the pattern in subimage 800b is resized to cover a smaller area 155i on the surface of the substrate 150 to accommodate for distortion in the substrate 150 and/or optics. To generate a larger subimage 800a, the pixel data representing resized subimage 800a is split into two exposures. During the first exposure at time $t_1$, the SLM 110 is loaded with pixel data representing a portion of resized subimage 800a and transfers the portion of resized subimage 800a onto area 155a of the substrate 150. During the second exposure at time $t_2$, the SLM 110 is loaded with pixel data representing the remainder of resized subimage 800a and pixel data representing resized subimage 800b, and transfers the remainder of resized subimage 800a and resized subimage 800b onto the area 155b of the substrate 150 during a single exposure. The remainder of resized subimage 800a is transferred onto area 155g of the substrate 150 and the resized subimage 800b is transferred onto area 155i of the substrate 150.

Figure 10:
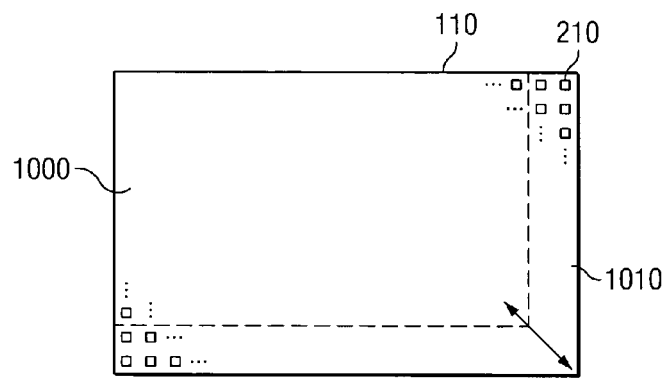
FIG. 10 illustrates another example of an image resizing technique, in accordance with embodiments of the present invention.

FIG. 10 illustrates another example of an image resizing technique, in accordance with embodiments of the present invention. In FIG. 10, the SLM 100 is configured to include, an active area 1000 of light modulation elements 210 and a reserve area 1010 of light modulation elements 210. The active area 1000 includes the light modulation elements 210 that are used to transfer the image onto the substrate, and the reserve area 1010 includes light modulation elements 210 that are not used to transfer the image onto the substrate. The number of light modulation elements 210 within the active area 1000 and reserve area 1010 for a particular exposure varies, depending on the type of resizing. Therefore, a pattern and corresponding image of the pattern on the surface can be resized by altering the number of light modulation elements within the active area 1000 and reserve area 1010.

Figure 11:
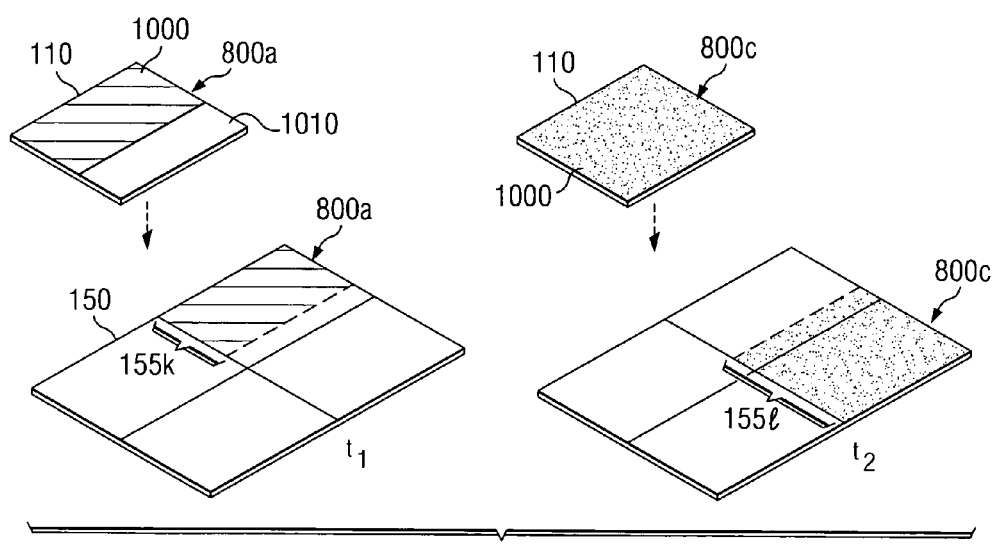
FIG. 11 illustrates a timing sequence for transferring resized subimages of the image onto the substrate surface using the image resizing technique of FIG. 10, in accordance with embodiments of the present invention.

For example, FIG. 11 illustrates a timing sequence for transferring resized subimages of a resized pattern onto the substrate surface using the image resizing technique of FIG. 10, in accordance with embodiments of the present invention. In FIG. 11, the pattern in subimage 800a is resized to cover a smaller area 155k on the surface of the substrate 150 and the pattern in subimage 800c is resized to cover a larger area 155l on the surface of the substrate 150 to accommodate for distortion in the substrate 150 and/or optics. During the exposure at time $t_1$, the SLM 110 is loaded with pixel data representing resized subimage 800a, and transfers resized subimage 800a onto area 155k of the substrate 150. The resized subimage 800a is loaded into the active area 1000 of light modulation elements within the SLM 110, and the reserve area 1010 of light modulation elements is not loaded with any data in order to produce smaller subimage 800a. During the exposure at time $t_2$, the SLM 110 is loaded with pixel data representing the resized subimage 800c, and transfers the resized subimage 800c onto area 155l of the substrate 150. To produce a larger subimage 800c, pixel data representing larger subimage 800c is loaded into the active area 1000 of light modulation elements within the SLM 110, which includes the entire array. There is no reserve area 1010 of light modulation elements within the SLM 110 to transfer larger subimage 800c.

Figure 12:
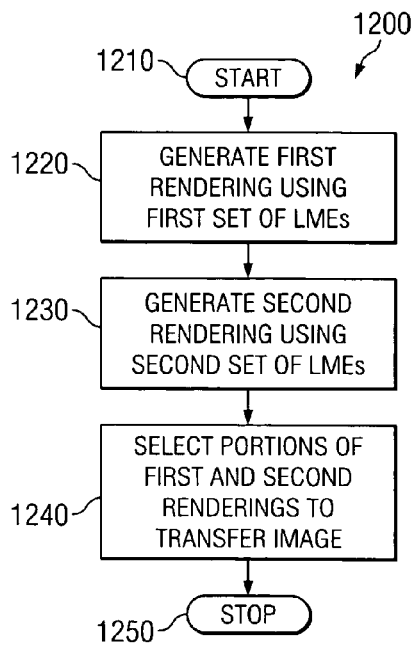
FIG. 12 is a flow chart illustrating an exemplary process for resizing a pattern in real time to dynamically photolithographically transfer an image of the resized pattern onto a surface, in accordance with embodiments of the present invention.

FIG. 12 is a flow chart illustrating an exemplary process 1200 for resizing a pattern to dynamically photolithographically transfer an image of the resized pattern onto a surface, in accordance with embodiments of the present invention. The resizing process 1200 starts at block 1210. At block 1220, a first rendering of a pattern is generated. The first rendering includes pixel data identifying a first set of light modulation elements representing the pattern. At block 1230, a second rendering of the pattern is generated. The second rendering includes pixel data identifying a second set of light modulation elements representing the pattern. The pattern in the first rendering is spatially offset from the pattern in the second renderings when mapped onto an array of light modulation elements within a spatial light modulator. At block 1240, selected portions of the first and second renderings are used to resize the pattern and to dynamically photolithographically transfer an image of the resized pattern onto the surface. The resizing process ends at block 1250.

Figure 13:
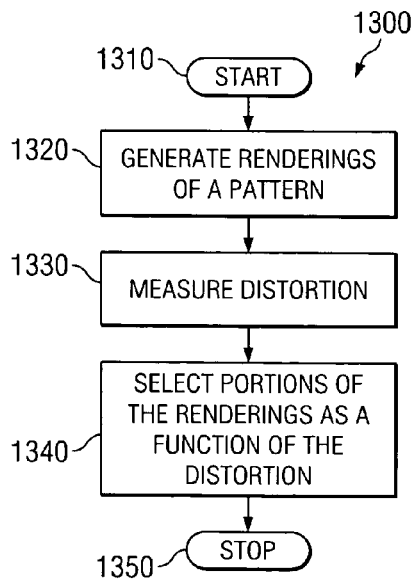
FIG. 13 is a flow chart illustrating an exemplary process for resizing a pattern as a function of distortion in real time, in accordance with embodiments of the present invention.

FIG. 13 is a flow chart illustrating an exemplary process 1300 for resizing a pattern as a function of distortion, in accordance with embodiments of the present invention. The resizing process 1300 starts at block 1310. At block 1320, spatially offset renderings of the pattern are generated. Each spatially offset rendering includes pixel data identifying respective light modulation elements within a spatial light modulator representing the pattern. The pattern is spatially offset in the spatially offset renderings when mapped onto an array of light modulation elements within the spatial light modulator. At block 1330, distortion in the surface or optics is measured. At block 1340, portions of the spatially offset renderings are selected as a function of the distortion to resize the pattern and to dynamically photolithographically transfer an image of the resized pattern onto the surface. The resizing process ends at block 1350.

Figure 14:
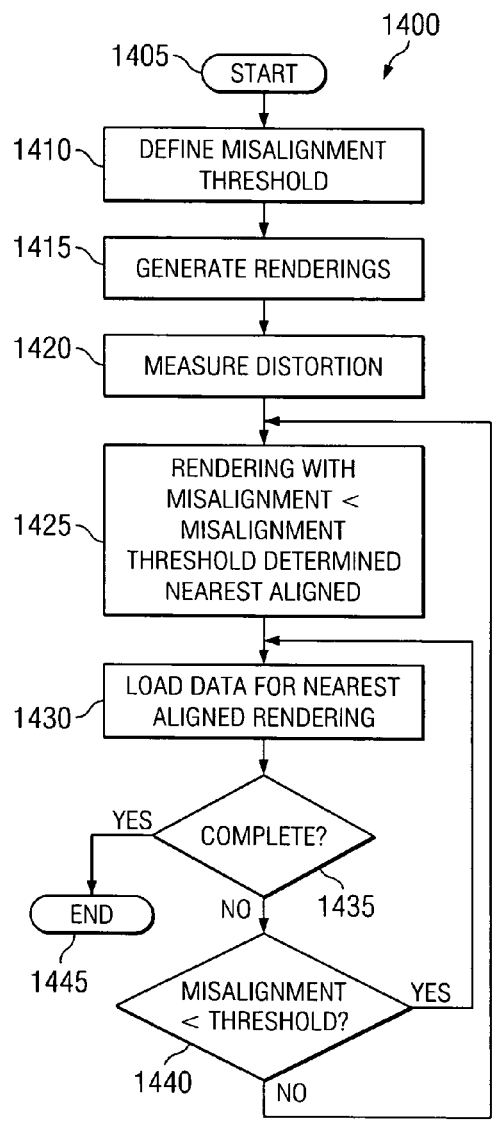
FIG. 14 is a flow chart illustrating an exemplary process for loading data from two or more spatially offset renderings of the image into the spatial light modulator using a misalignment threshold, in accordance with embodiments of the present invention.

FIG. 14 is a flow chart illustrating an exemplary process 1400 for loading data from two or more spatially offset renderings of the image into the spatial light modulator using a misalignment threshold, in accordance with embodiments of the present invention. The data loading process 1400 starts at block 1405. At block 1410, a misalignment threshold is defined, and at block 1415, spatially offset renderings of a pattern are generated. Each spatially offset rendering includes pixel data identifying respective light modulation elements within a spatial light modulator representing the pattern. The pattern is spatially offset in the spatially offset renderings when mapped onto an array of light modulation elements within the spatial light modulator.

At block 1420, distortion of the surface or in the optics is measured. At block 1425, one of the spatially offset renderings of the pattern that produces a misalignment with the surface as a function of the distortion less than the misalignment threshold is determined to be the nearest aligned rendering, and at block 1430, pixel data corresponding to the nearest aligned rendering is loaded into the spatial light modulator. Pixel data from the nearest aligned rendering is sequentially loaded into the spatial light modulator until the pattern to be transferred is completely loaded at block 1435 or the nearest aligned rendering develops a misalignment with the surface greater than the misalignment threshold at block 1440. If a misalignment greater than the misalignment threshold is determined, another nearest aligned rendering having a misalignment less than the misalignment threshold is selected and the process of sequentially loading the pixel data continues at block 1430. The data loading process ends at block 1350.

Figure 15:
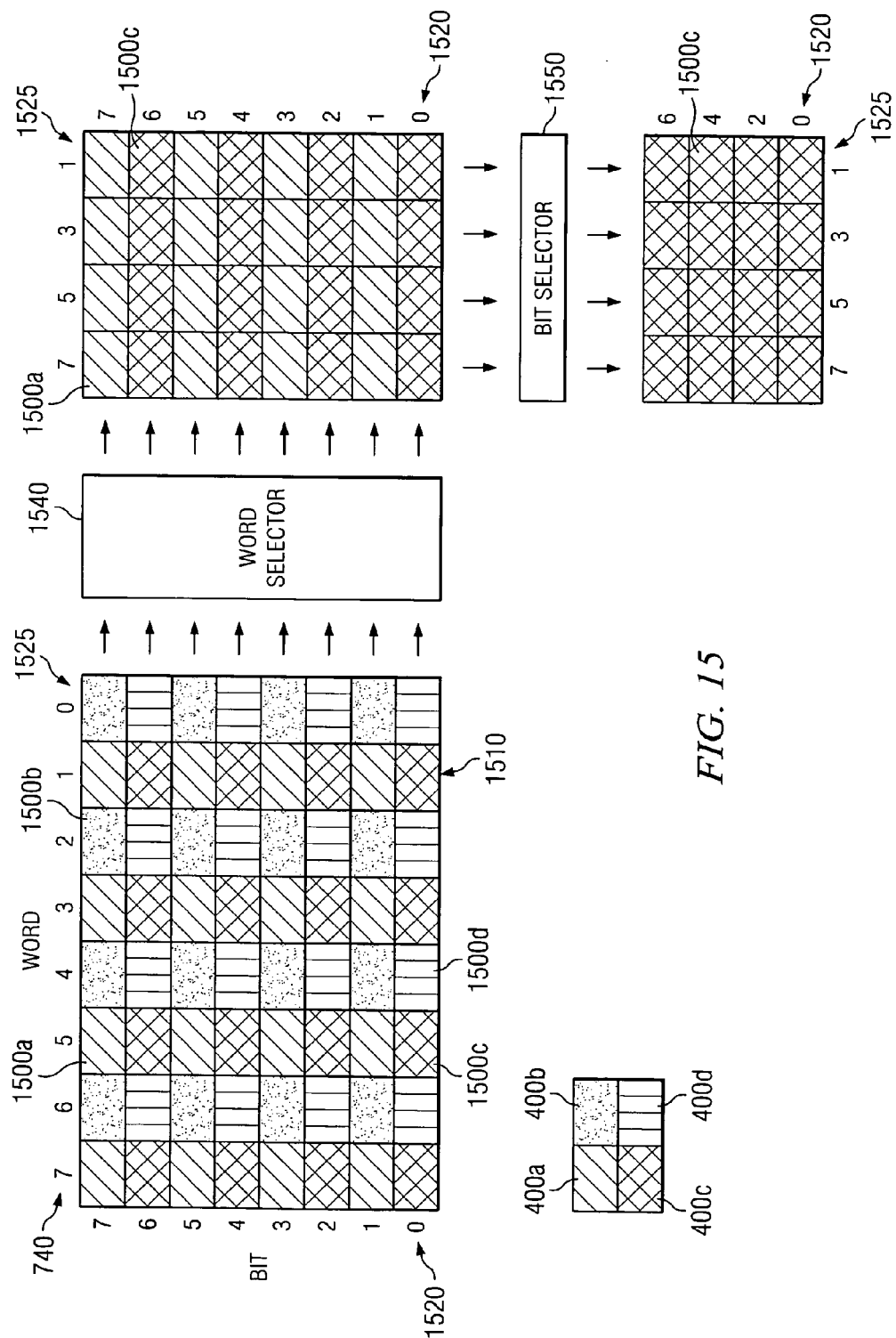
FIG. 15 is an illustration of a data interleaving technique for storing the pixel data for each of the spatially offset renderings of the image.

FIG. 15 is an illustration of a data interleaving technique for storing pixel data 1500a–d for each of the spatially offset renderings 400a–d. In applications where multiple dynamic photolithography systems are transferring the same pattern onto different substrates, the renderings 400a–d can be generated offline, compressed and transferred to the multiple dynamic photolithography systems. To enhance the encoding efficiency of the renderings, the pixel data 1500a–d from all of the renderings 400a–d can be interleaved together prior to compression.

In FIG. 15, four renderings 400a–d are shown stored within storage unit 740. The pixel data 1500a–d from all of the respective image renderings 400a–d is interleaved together within a memory array 1510 of the storage unit 740. For example, pixel data 1500a and 1500b corresponding to renderings 400a and 400b are stored in alternating columns 1525 of the same rows 1520 of the memory array 1510. Likewise, pixel data 1500c and 1500d corresponding to renderings 400c and 400d are stored in alternating columns 1525 of the same rows 1520 of the memory array 1510. In FIG. 15, the columns are referred to as words, and the rows are referred to as bits. To select pixel data (e.g., pixel data 1500c) from one of the renderings (e.g., rendering 400c), the pixel data 1500a–d is input to a word selector 1540 to select pixel data 1500a and 1500c from only those columns 1525 that include pixel data 1500c corresponding to rendering 400c. The remaining pixel data 1500a and 1500c is input to a bit selector 1550 to select pixel data 1500c from only those rows 1520 that include pixel data 1500c corresponding to rendering 400c. By interleaving the pixel data 1500a–d instead of storing separate planes of pixel data 1500a–d for each rendering 400a–d, the spatial frequency of the renderings is decreased, which improves the encoding efficiency of the pixel data 1500a–d.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

I claim:

1. A method for resizing a pattern in real time to dynamically photolithographically transfer an image of the resized pattern onto a surface, said method comprising:

generating a first rendering of the pattern, the first rendering including first pixel data representing the pattern;

generating a second rendering of the pattern, the second rendering including second pixel data representing the pattern, the pattern in the second rendering being spatially offset from the pattern in the first rendering; and selecting portions of the first and second pixel data to form the resized pattern and to dynamically photolithographically transfer the image of the resized pattern onto the surface.

2. The method of claim 1, further comprising:

generating at least a third rendering of the pattern, the pattern in the third rendering being spatially offset from the pattern in both the first and second renderings, said selecting being performed based on at least the first, second and third renderings.

3. The method of claim 1, wherein said generating the first rendering includes mapping the pattern onto an array of light modulation elements within a spatial light modulator in a first positional alignment relative to the array, and said generating the second rendering includes mapping the pattern onto the array in a second positional alignment relative to the array.

4. The method of claim 3, wherein the first and second positional alignments are offset by a fraction of a dimension of one of the light modulation elements.

5. The method of claim 1, further comprising:

determining a distortion in the surface and performing said selecting as a function of the distortion.

6. The method of claim 5, wherein said determining further comprises:

positioning the surface in at least one position relative to an image sensor operable to image at least one alignment feature located on the surface; and calculating the location of the at least one alignment feature on the surface to determine the distortion in the surface.

7. The method of claim 5, wherein said selecting further comprises:

defining a misalignment threshold;

selecting the first pixel data from a portion of the first rendering corresponding to a first region of an array of light modulation elements within a spatial light modulator, the portion of the first rendering producing a misalignment of the pattern relative to the surface as a function of the distortion in the surface less than the misalignment threshold; and selecting the second pixel data from a portion of the second rendering corresponding to a second region of the array, the portion of the second rendering producing a misalignment of the pattern relative to the surface as a function of the distortion in the surface less than the misalignment threshold.

8. The method of claim 7, wherein said selecting the second pixel data further comprises:
determining at least one region in the array where the misalignment of the first rendering is greater than the misalignment threshold; and
selecting the second pixel data from the portion of the second rendering corresponding to the at least one region of the array.

9. The method of claim 1, further comprising:
determining a distortion in at least one optical element, said selecting being performed as a function of the distortion.

10. A method for resizing a pattern in real time to dynamically photolithographically transfer an image of the resized pattern onto a surface, said method comprising:
generating two or more spatially offset renderings of the image, each spatially offset rendering including respective pixel data representing the pattern, the pattern being spatially offset between the renderings;
measuring a distortion; and
selecting the pixel data from portions of the two or more spatially offset renderings as a function of the distortion to form the resized pattern and to dynamically photolithographically transfer the image of the resized pattern onto the surface.

11. The method of claim 10, wherein said determining further comprises:
positioning the surface in at least one position relative to an image sensor operable to image at least one alignment feature located on the surface; and
calculating the location of the at least one alignment feature on the surface to determine the distortion in the surface.

12. The method of claim 11, wherein said positioning further comprises:
aligning the surface relative to an optical element optically coupled to the image sensor.

13. The method of claim 11, wherein said positioning further comprises:
aligning the surface relative to an optical element optically coupled to the image sensor and the spatial light modulator.

14. The method of claim 11, wherein said calculating further comprises:
computing at least one of the following distortion characteristics: stretching, shrinking, tilting and bowing.

15. The method of claim 10, wherein said selecting further comprises:
defining a misalignment threshold; and
selecting the pixel data from the portions of the two or more spatially offset renderings that produce a misalignment of the pattern relative to the surface as a function of the distortion in the surface less than the misalignment threshold.

16. The method of claim 10, further comprising:
storing the pixel data from the spatially offset renderings by interleaving the pixel data from each of the spatially offset renderings.

17. A dynamic photolithography system, comprising:
a spatial light modulator including light modulation elements for dynamically photolithographically transferring an image of a pattern onto a surface; and
an image processing system operable to generate and store two or more spatially offset renderings of the pattern, each spatially offset rendering including respective pixel data identifying respective light modulation elements within said spatial light modulator representing the pattern, the pattern being spatially offset between the renderings, said image processing system being further operable to produce a resultant rendering of the pattern based on select pixel data corresponding to selected portions of the two or more spatially offset renderings of the pattern, and to load the resultant rendering of the pattern into said spatial light modulator for forming an image that corresponds to the resultant rendering of the pattern.

18. The dynamic photolithography system of claim 17, wherein the light modulation elements are arranged in an array, and wherein said image processing system is operable to generate the two or more spatially offset renderings of the pattern by mapping the pattern onto the array in respective positional alignments relative to the array.

19. The dynamic photolithography system of claim 18, wherein the positional alignments are offset from each other by a fraction of a dimension of one of the light modulation elements.

20. The dynamic photolithography system of claim 17, further comprising:
an image sensor connected to provide an image of at least one alignment feature located on the surface to said image processing system, said image processing system being further operable to calculate distortion in the surface as a function of the location of the at least one alignment feature on the surface.

21. The dynamic photolithography system of claim 20, further comprising:
an optical element optically coupled to said image sensor and aligned with the surface.

22. The dynamic photolithography system of claim 21, wherein said optical element is optically coupled to said image sensor and said spatial light modulator.

23. The dynamic photolithography system of claim 20, wherein the distortion includes at least one of: stretching, shrinking, tilting and bowing.

24. The dynamic photolithography system of claim 20, wherein the select pixel data is loaded as a function of the distortion.

25. The dynamic photolithography system of claim 24, wherein said spatial light modulator includes active light modulation elements and reserve light modulation elements, the select pixel data loaded into said spatial light modulator corresponding to at least a portion of the active light modulation elements based on the distortion.

26. The dynamic photolithography system of claim 24, wherein the image corresponding to the resultant rendering of the pattern includes subimages, the pixel data loaded into said spatial light modulator representing at least a portion of one of the subimages based on the distortion.

27. The dynamic photolithography system of claim 17, wherein the surface has a distortion, and wherein said image processing system is further operable to define a misalignment threshold and select portions of the two or more renderings producing a misalignment of the pattern relative to the surface as a function of the distortion in the surface less than the misalignment threshold.

28. The dynamic photolithography system of claim 17, wherein the light modulation elements are operable to be altered as a function of the loaded pixel data.

29. The dynamic photolithography system of claim 28, wherein the light modulation elements are liquid crystal elements.

30. The dynamic photolithography system of claim 28, wherein the light modulation elements are micromirrors.

31. An image processing system for use in a dynamic photolithography system, comprising:
- a storage unit for storing two or more renderings of a pattern to be photolithographically transferred onto a surface, the pattern being spatially offset between the two or more renderings;
- a processor operable to generate the two or more spatially offset renderings, each spatially offset rendering including respective pixel data identifying respective pixels representing the pattern, said processor being further operable to access the storage unit and retrieve select pixel data corresponding to selected portions of the two or more spatially offset renderings, and to produce, based on the retrieved pixel data, a resultant rendering of the pattern for use in forming an image that corresponds to the resultant rendering of the pattern.

32. The image processing system of claim 31, wherein said image processing system is further operable to calculate distortion in the surface and retrieve the select pixel data corresponding to the selected portions of the two or more spatially offset renderings as a function of the distortion.

33. The image processing system of claim 32, wherein said image processing system is further operable to define a misalignment threshold and select portions of the two or more renderings producing a misalignment of the pattern relative to the surface as a function of the distortion in the surface less than the misalignment threshold.

* * * * *